US008878290B2

(12) United States Patent
Takaya et al.

(10) Patent No.: US 8,878,290 B2
(45) Date of Patent: Nov. 4, 2014

(54) SEMICONDUCTOR DEVICE

(71) Applicants: Hidefumi Takaya, Miyoshi (JP);
Narumasa Soejima, Seto (JP)

(72) Inventors: Hidefumi Takaya, Miyoshi (JP);
Narumasa Soejima, Seto (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 14/046,361

(22) Filed: Oct. 4, 2013

(65) Prior Publication Data

US 2014/0097490 A1   Apr. 10, 2014

(30) Foreign Application Priority Data

Oct. 9, 2012   (JP) .................................. 2012-224078

(51) Int. Cl.
*H01L 29/78*   (2006.01)

(52) U.S. Cl.
CPC .................................. *H01L 29/7831* (2013.01)
USPC ............. 257/330; 257/59; 257/151; 257/153; 257/366; 257/E29.125

(58) Field of Classification Search
CPC ................... H01L 29/66704; H01L 29/66734; H01L 29/4236
USPC ............. 257/59, 330, 151, 153, 366, E29.125
See application file for complete search history.

(56) References Cited

U.S. PATENT DOCUMENTS

2006/0065924 A1* 3/2006 Yilmaz .......................... 257/328
2010/0276729 A1* 11/2010 Aoi et al. ...................... 257/139

FOREIGN PATENT DOCUMENTS

| JP | 2005-116822 A | 4/2005 |
| JP | 2008-078175 A | 4/2008 |
| JP | 2010-114163 A | 5/2010 |

* cited by examiner

*Primary Examiner* — Marc Armand
(74) *Attorney, Agent, or Firm* — Kenyon & Kenyon LLP (57) ABSTRACT

A semiconductor substrate of a semiconductor device includes a body region of a first conductivity type, a drift region of a second conductivity type coming into contact with a lower surface of the body region, a gate electrode that is provided in a gate trench passing through the body region and extending to the drift region and faces the body region, and a gate insulator that is provided between the gate electrode and a wall surface of the gate trench. An inverted U-shaped section is formed in a lower surface of the gate insulator, and a floating region of the first conductivity type is formed in the inverted U-shaped section. The floating region protrudes under a portion that is located at a lowermost portion in the lower surface of the gate insulator.

3 Claims, 6 Drawing Sheets

SEMICONDUCTOR DEVICE

INCORPORATION BY REFERENCE

The disclosure of Japanese Patent Application No. 2012-224078 filed on Oct. 9, 2012 including the specification, drawings and abstract is incorporated herein by reference in its entirety.

BACKGROUND OF THE INVENTION

1. Field of the Invention

The present invention relates to a semiconductor device. More particularly, the present invention relates to a technique for improving a withstand voltage characteristic of the semiconductor device of a trench gate type.

2. Description of Related Art

In order to improve the withstand voltage characteristic of the semiconductor device, the semiconductor device in which a floating region is formed at the bottom of a gate trench (that is, a gate insulator) is known in the related art (for example, Japanese Patent Application Publication No. 2005-116822 (JP 2005-116822 A)). In the semiconductor device disclosed in JP 2005-116822 A, when the semiconductor device is turned off, two peaks of electric fields are produced at a boundary between a body region and a drift region and a boundary between the floating region and the drift region. The maximum peak value of an electric field can be limited by producing the peak of the electric field at a plurality of positions. Accordingly, withstand voltage characteristic of the semiconductor device is improved.

In the semiconductor device of this type, the position and the shape of the floating region at the bottom of the gate trench are changed according to the characteristics required for the semiconductor device. For example, there is a case where the floating region at the bottom of the gate trench is required to be formed in the vicinity of the body region in order to relax the electric field applied to the gate insulator. In such a case, the semiconductor device having a conventional structure may cause a connection between a depletion layer extending from the body region and a depletion layer extending from the floating region under a condition where a bias is not applied to the semiconductor device when the floating region is arranged in the vicinity of the body region. When these depletion layers are connected to each other, there is a possibility of an increase in ON-resistance.

SUMMARY OF THE INVENTION

The present invention discloses the semiconductor device in which the floating region is provided in the vicinity of the body region while the ON-resistance is inhibited from increasing.

The semiconductor device according to one aspect of the present invention includes: a semiconductor substrate that includes a body region of a first conductivity type formed in an upper surface of the semiconductor substrate, a drift region of a second conductivity type that is contacted with a lower surface of the body region, a gate electrode that is provided in a gate trench passing through the body region and extending to the drift region and faces the body region, a gate insulator that is provided between the gate electrode and a wall surface of the gate trench and formed with an inverted U-shaped section in a lower surface; and a floating region of the first conductivity type that is enclosed by the inverted U-shaped section and the drift region and in which a lower surface of the floating region is formed under a portion that is located at a lowermost portion in the lower surface of the gate insulator; a first main electrode that is formed on the upper surface of the semiconductor substrate and connected to the body region; and a second main electrode that is formed on a lower surface of the semiconductor substrate.

It should be noted that the "first conductivity type" or the "second conductivity type" means either n-type or p-type. In other words, when the "first conductivity type" is the p-type, the "second conductivity type" becomes the n-type, and when the "first conductivity type" is the n-type, the "second conductivity type" becomes the p-type.

According to the above aspect, while the ON-resistance can be inhibited from increasing, the floating region can be provided in the vicinity of the body region.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

The semiconductor device according to the present invention may have a width of a floating region within a range of a width of a gate trench in a cross section where the semiconductor substrate is cut away in a plane that is perpendicular to an upper surface of the semiconductor substrate and also orthogonal to a longitudinal direction of the gate trench. According to such a structure, connection between a depletion layer extending from the floating region and a depletion layer extending from a body region can be inhibited.

In the semiconductor device according to the present invention, the width of the floating region may fit within the width of an inverted U-shaped section in the cross section described above. According to such a structure, the connection between the depletion layer extending from the floating region and the depletion layer extending from the body region can be further inhibited.

Figure 1:
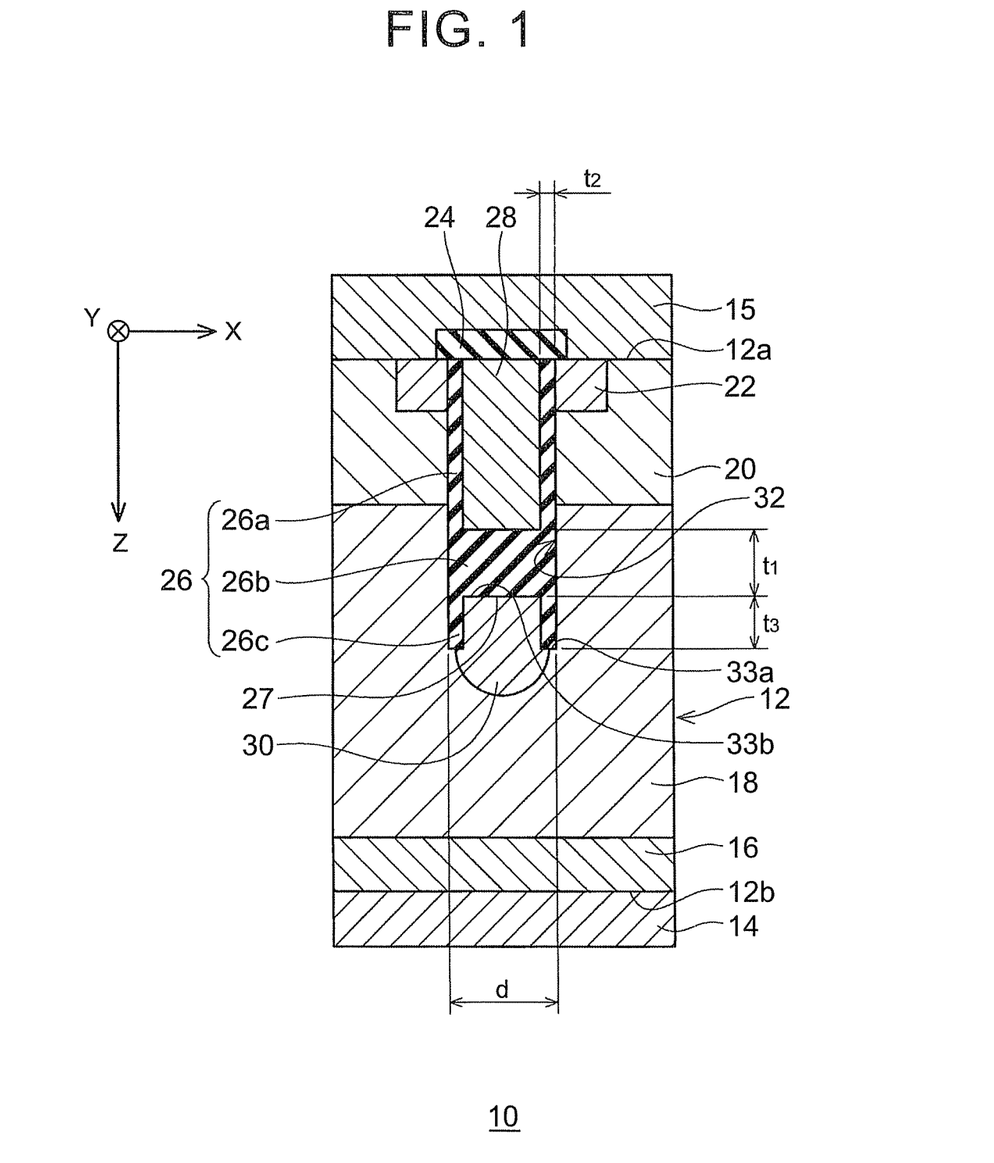
FIG. 1 is a vertical cross-sectional view of a semiconductor device according to an embodiment of the present invention.

A semiconductor device 10 of this embodiment will be described with reference to the accompanying drawings. As shown in FIG. 1, the semiconductor device 10 includes a semiconductor substrate 12 and electrodes 14 and 15 that are respectively formed on an upper surface 12a and a lower surface 12b of the semiconductor substrate 12. It should be noted that a well-known substrate (such as a silicon carbide substrate (SiC substrate) and a silicon substrate (Si substrate)) is used for the semiconductor substrate 12.

A vertical field effect transistor (MOSFET) is formed in the semiconductor substrate 12. In other words, a plurality of gate trenches 32 are formed in the upper surface 12a of the semiconductor substrate 12. However, only one gate trench 32 is shown in FIG. 1. The gate trench 32 extends in a Y-direction of FIG. 1 (a direction normal to the sheet of the drawing or a direction as viewed from in front of the drawing toward the back of the sheet). In other words, the direction normal to the sheet of the drawing is the longitudinal direction of the gate trench 32. The gate trenches 32 are arranged in an X-direction of FIG. 1 at regular intervals. The gate trench 32 passes through a source region 22 and a body region 20 that are described below, and the lower end of the gate trench 32 extends to a drift region 18. Sides of the gate trench 32 extend in a Z-direction of FIG. 1 and are approximately perpendicular to the upper surface 12a of the semiconductor substrate 12. In addition, a spacing between the sides of the gate trench 32 (that is, a width of the gate trench 32 in the X-direction) is set as d. The lower surface of the gate trench 32 is deeply formed at ends 33a in the X-direction and shallowly formed in a middle portion 33b as shown in FIG. 1. In other words, the ends 33a in the lower surface of the gate trench 32 are formed deeper than the middle portion 33b with $t_3$. It should be noted that the middle portion 33b in the lower surface of the gate trench 32 is approximately in parallel with the upper surface 12a of the semiconductor substrate 12.

A gate electrode 28 is formed in the gate trench 32. The gate electrode 28 extends in the Y-direction of FIG. 1, and the lower end of the gate electrode 28 is formed to be slightly deeper than the lower surface of the body region 20. A gate insulator 26 is formed between wall surfaces of the gate trench 32 and the gate electrode 28 (that is, lateral to and under the gate electrode 28). Therefore, the gate electrode 28 faces the body region 20 and the source region 22 through the gate insulator 26. As described above, the lower surface of the gate trench 32 is shallowly formed in the middle portion 33b, and the ends 33a of the gate trench 32 are deeply formed. Accordingly, the gate insulator 26 is formed with an inverted U-shaped section 27 that is bowed upward in the lower surface of the gate insulator 26. In other words, the gate insulator 26 includes side surface portions 26a that are formed on sides of the gate trench 32, a lower surface portion 26b that is formed in the lower surface of the gate trench 32, and protruding portions 26c that protrude downward from ends of the lower surface portion 26b (ends in the X-direction). The inverted U-shaped section 27 is formed between the two protruding portions 26c. The thickness of each side surface portion 26a is determined as $t_2$ which is equal to the thickness of each protruding portion 26c. On the other hand, the thickness $t_1$ of the lower surface portion 26b is formed to be thicker than the thickness $t_2$ of the side surface portion 26a. An interlayer dielectric 24 is formed on the top of the gate electrode 28.

An n+ type source region 22 and a p− type body region 20 are formed in the region facing the upper surface 12a of the semiconductor substrate 12. The source region 22 is formed to make contact with the gate insulator 26. The p− type body region 20 is formed lateral to and under the source region 22. The body region 20 comes into contact with the source region 22 and also with the gate insulator 26 under the source region 22. Therefore, the source region 22 becomes surrounded by the body region 20. An n− type drift region 18 is formed under the body region 20. The drift region 18 comes into contact with the lower surface of the body region 20. The drift region 18 is separated from the source region 22 by the body region 20.

An n+ type drain region 16 is formed in the region facing the lower surface 12b of the semiconductor substrate 12. The drain region 16 is formed in entire underlying surfaces of the semiconductor substrate 12. The impurity concentration of the drain region 16 is determined to be higher than the impurity concentration of the drift region 18. The drain region 16 comes into contact with the lower surface of the drift region 18. The drain region 16 is separated from the body region 20 by the drift region 18.

The drain electrode 14 is formed on the lower surface 12b of the semiconductor substrate 12. The drain electrode 14 is formed in the entire underlying surfaces of the semiconductor substrate 12. The drain electrode 14 makes ohmic contact with the drain region 16. A source electrode 15 is formed on the upper surface 12a of the semiconductor substrate 12. The source electrode 15 is formed to cover the interlayer dielectric 24 and insulated from the gate electrode 28. The source electrode 15 makes ohmic contact with the source region 22.

A p− type floating region 30 is formed at the bottom of the gate trench 32 in the drift region 18 described above. Specifically, the floating region 30 is formed in the inverted U-shaped section 27 that is formed in the lower surface of the gate insulator 26 (that is, between the protruding portions 26c of the gate insulator 26). Therefore, the floating region 30 is enclosed by the gate insulator 26 and the drift region 18. The floating region 30 is separated from the body region 20 by the drift region 18, and the potential of the floating region 30 is brought into a floating state. As becomes apparent from FIG. 1, the width of the floating region 30 (the width in the X-direction in the cross section shown in FIG. 1) is determined to be smaller than the width d of the gate trench 32, and the floating region 30 fits within the width of the gate trench 32. In addition, the floating region 30 protrudes downward from portions that are located at the lowermost positions of the gate insulator 26 (that is, the lower ends of the protruding portions 26c). The dimensions and the p-type impurity concentration of the floating region 30 are adjusted so that the floating region 30 does not become totally depleted when a reverse rated voltage (a voltage in the direction where the potential of the drain electrode 14 is higher than the potential of the source electrode 15) is applied across the semiconductor device 10.

Operation of the semiconductor device 10 will be described below. When an ON-potential (a potential higher than the potential required for the formation of a channel) is applied on the gate electrode 28 under conditions where the drain electrode 14 is connected to a power supply potential and the source electrode 15 is connected to a ground potential, the semiconductor device 10 is turned on. In other words, the channel is formed in the body region 20 within the range where the body region 20 comes into contact with the gate insulator 26 through the application of the ON-potential on the gate electrode 28. Accordingly, electrons flow from the source electrode 15 to the drain electrode 14 through the source region 22, the channel in the body region 20, the drift region 18, and the drain region 16. In other words, an electric current flows from the drain electrode 14 to the source electrode 15.

When the potential applied on the gate electrode 28 is changed from the ON-potential to an OFF-potential, the semiconductor device 10 is turned off. When the semiconductor device 10 is turned off, the depletion layer expands from a PN junction between the body region 20 and the drift region 18. When the depletion layer reaches the floating region 30, the depletion layer further expands from the PN junction between the floating region 30 and the drift region 18. Because two peaks of the electric field are produced, withstand voltage characteristic of the semiconductor device 10 can be improved.

In the semiconductor device 10 of this embodiment, the floating region 30 is formed in the inverted U-shaped section 27 that is formed in the lower surface of the gate insulator 26. Therefore, the floating region 30 can be provided in the vicinity of the body region 20 in comparison with the structure of the related art. In other words, in a case where the inverted U-shaped section 27 is not formed in the lower surface of the gate insulator 26 as in the case of the related art, the floating region 30 is formed at a lower position with a distance of $t_1+t_3$ from the gate electrode 28. On the other hand, because the inverted U-shaped section 27 is formed in the lower surface of the gate insulator 26 in the semiconductor device 10 of this embodiment, the floating region 30 is formed at a lower position with a distance of $t_1$ only from the gate electrode 28. That is, the floating region 30 can be provided in the vicinity of the body region 20. In addition, the floating region 30 is aimed to protrude downward from the lowermost ends of the gate insulator 26 in sufficient size. In other words, the lower surface of the floating region 30 is formed under a portion that is located at a lowermost portion in the lower surface of the gate insulator 26. That is, the floating region 30 is formed in a size in which the floating region 30 does not become totally depleted when a reverse bias is applied across the semiconductor device 10. Thus, when the semiconductor device 10 is turned off, much electric field can be retained by the floating region 30, and the large electric field can be prevented from being applied to the boundary between the body region 20 and the drift region 18. As a result, the gate insulator 26 can be inhibited from being damaged. Particularly, the large electric field is applied on the gate insulator 26 in the semiconductor device using the SiC substrate, and therefore the structure of this embodiment has advantages.

On the other hand, when the floating region 30 is provided in the vicinity of the body region 20, the possibility of the connection between the depletion layer extending from the body region 20 and the depletion layer extending from the floating region 30 may be increased under a condition where the bias is not applied across the semiconductor device 10. However, in the semiconductor device 10 of this embodiment, the floating region 30 is formed in the inverted U-shaped section 27 in the lower surface of the gate insulator 26. Therefore, the depletion layer extending from the floating region 30 is inhibited from extending toward the body region 20 beyond the protruding portion 26c of the gate insulator 26. In addition, because the floating region 30 is formed in the inverted U-shaped section 27 of the gate insulator 26, when the size of the floating region 30 is increased, the floating region 30 can be inhibited from being extended in the width direction (X-direction) of the gate insulator 26. Accordingly, the connection between the depletion layer extending from the body region 20 and the depletion layer extending from the floating region 30 can be inhibited. As a result, ON-resistance of the semiconductor device 10 can be inhibited from increasing. In addition, the floating region 30 protrudes downward from the lower surface of the gate insulator 26, and the sufficient size of the floating region 30 can be secured. Therefore, in this semiconductor device 10, while the ON-resistance can be inhibited from increasing, the floating region 30 can be provided in the vicinity of the body region 20.

The semiconductor device 10 described above can be produced through the following methods. It should be noted that the structure other than the structure of the gate portion (that is, the gate electrode 28, the gate trench 32, the gate insulator 26, and the floating region 30) can be produced through a well-known method, and therefore the description of the method is not made herein.

Figure 2:
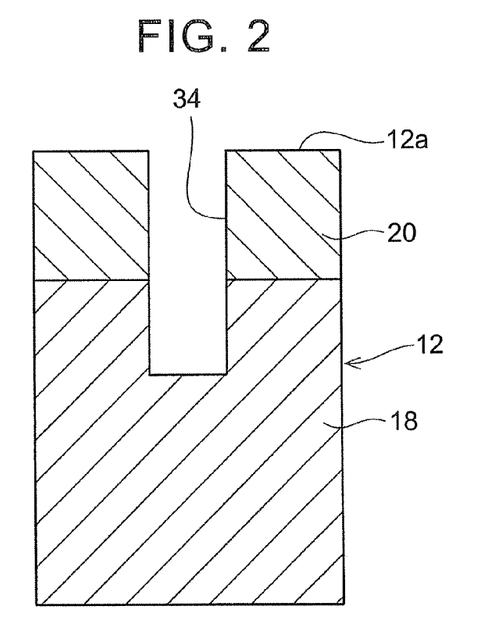
FIG. 2 is a diagram that illustrates a first process for producing the semiconductor device in FIG. 1.
Figure 3:
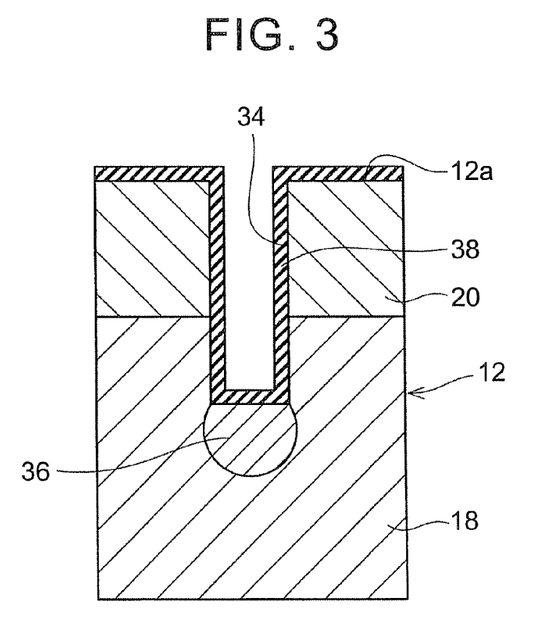
FIG. 3 is a diagram that illustrates a second process for producing the semiconductor device in FIG. 1.

As shown in FIG. 2, a trench 34 is first formed in the upper surface 12a of the semiconductor substrate 12. The trench 34 can be formed by means of dry etching, for example. Next, as shown in FIG. 3, an insulator 38 is formed on the upper surface 12a of the semiconductor substrate 12 and an inner surface of the trench 34. A material with a high etching rate (such as TEOS or $SiO_2$, for example) is used for the insulator 38. The insulator 38 can be formed by means of a CVD method, for example. Then, a mask (not shown) is formed on the semiconductor substrate 12, p-type impurities are doped via the mask, and a p-type impurity region 36 is formed at the bottom of the trench 34 (FIG. 3). It should be noted that the p-type impurities are doped under a condition where the insulator 38 is formed on the sides of the trench 34. Therefore, the p-type impurities can be inhibited from being doped into the drift region 18 in the vicinity of the sides of the trench 34.

Figure 4:
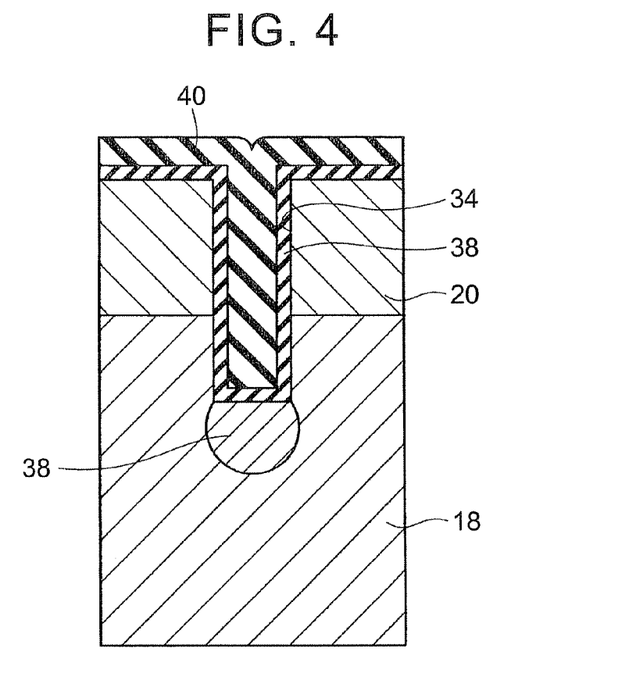
FIG. 4 is a diagram that illustrates a third process for producing the semiconductor device in FIG. 1.

As shown in FIG. 4, an insulator 40 is formed on the upper surface of the insulator 38, and the trench 34 is filled with the insulator 40. A material with a lower etching rate than the insulator 38 (such as SiN, BPSG, or PSG, for example) is used for the insulator 40. The insulator 40 can be formed by means of the CVD method, for example.

Figure 5:
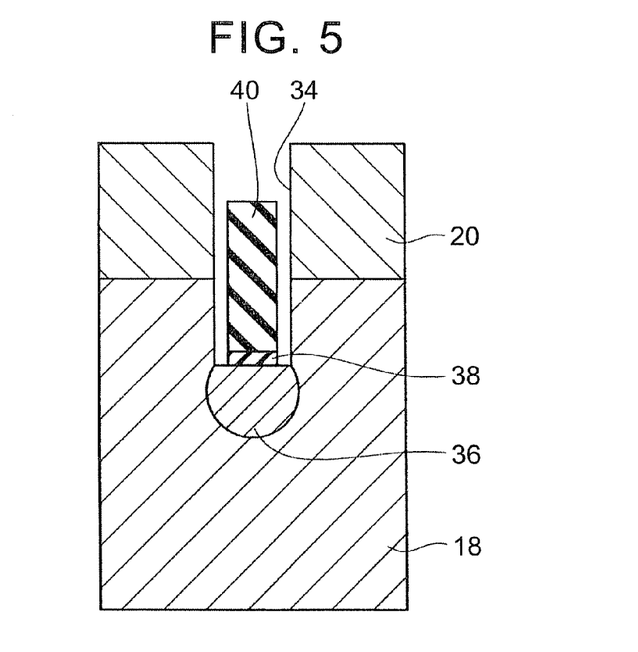
FIG. 5 is a diagram that illustrates a fourth process for producing the semiconductor device in FIG. 1.

Then, the insulators 38 and 40 formed on the semiconductor substrate 12 are removed by means of wet etching, and a state shown in FIG. 5 is achieved. The etching rate of the insulator 38 is determined to be higher than the etching rate of the insulator 40. Therefore, when the insulators 38 and 40 are wet-etched simultaneously, the insulators 38 and 40 remain only in the middle portion of the trench 34, and the sides of the trench 34 can be exposed as shown in FIG. 5.

Figure 6:
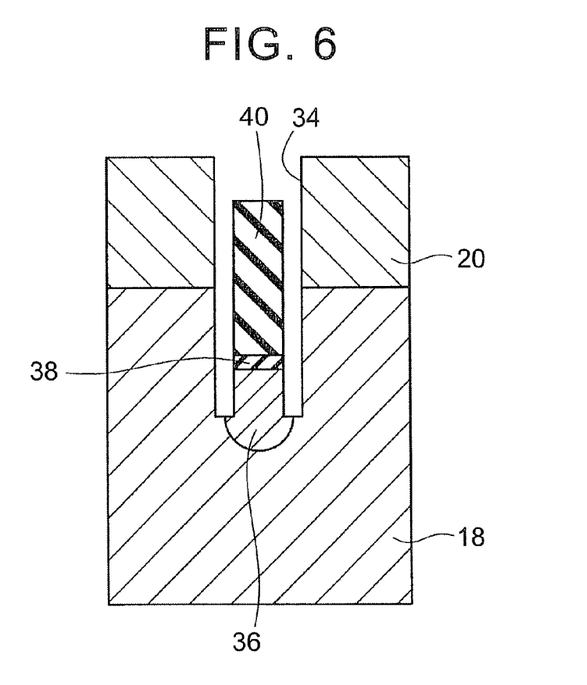
FIG. 6 is a diagram that illustrates a fifth process for producing the semiconductor device in FIG. 1.

Next, as shown in FIG. 6, the semiconductor substrate 12 (specifically, ends in the lower surface of the trench 34 (that is, portions that are not covered with the insulators 38 and 40)) is wet-etched. Accordingly, the lower surface of the trench 34 is deeply formed at the ends and shallowly formed in the middle portion. Side walls of the trench 34 are also etched. As a result, a portion where the p-type impurities are doped in the vicinity of a side wall of the trench 34 is also removed. Accordingly, the depletion layer extending from the floating region 30 hardly connects to the depletion layer extending from the body region 20 as described below.

Figure 7:
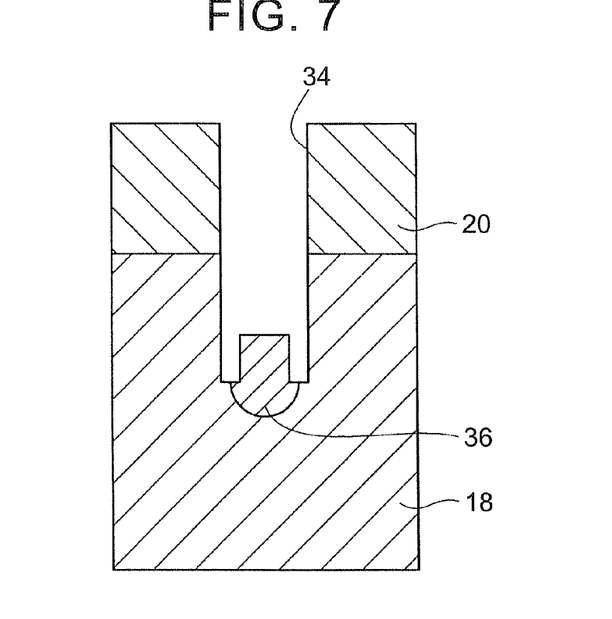
FIG. 7 is a diagram that illustrates a sixth process for producing the semiconductor device in FIG. 1.
Figure 8:
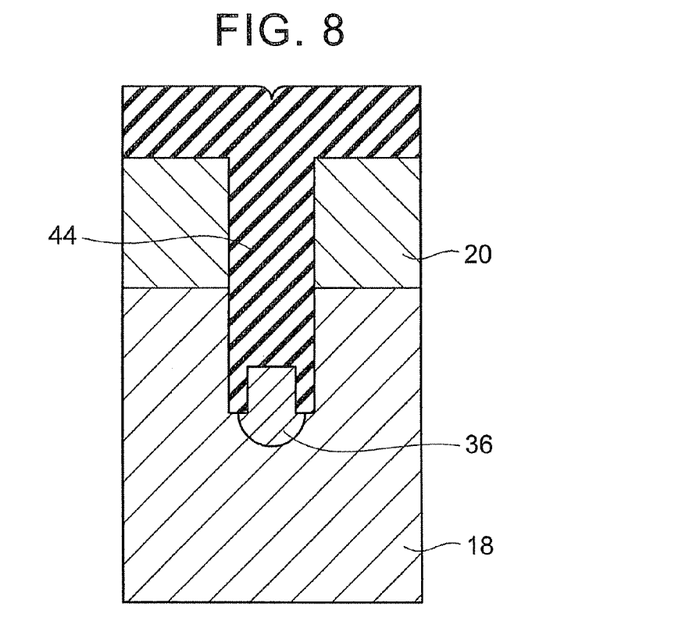
FIG. 8 is a diagram that illustrates a seventh process for producing the semiconductor device in FIG. 1.
Figure 9:
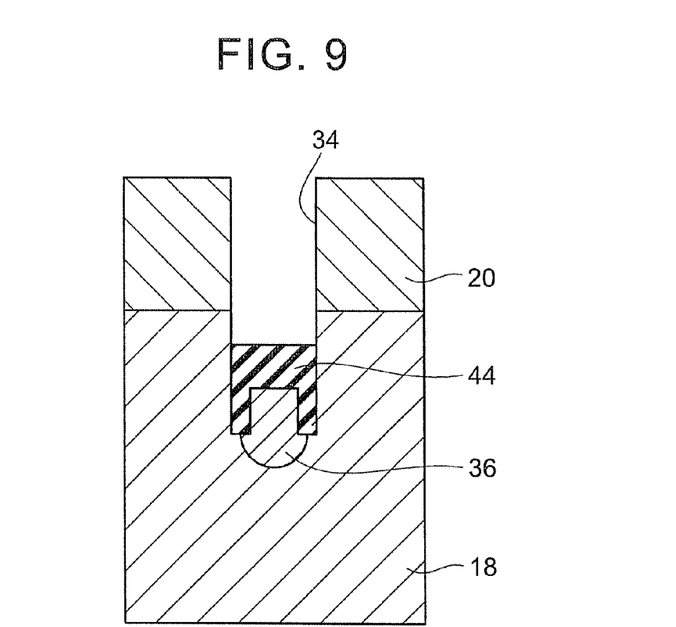
FIG. 9 is a diagram that illustrates an eighth process for producing the semiconductor device in FIG. 1.
Figure 10:
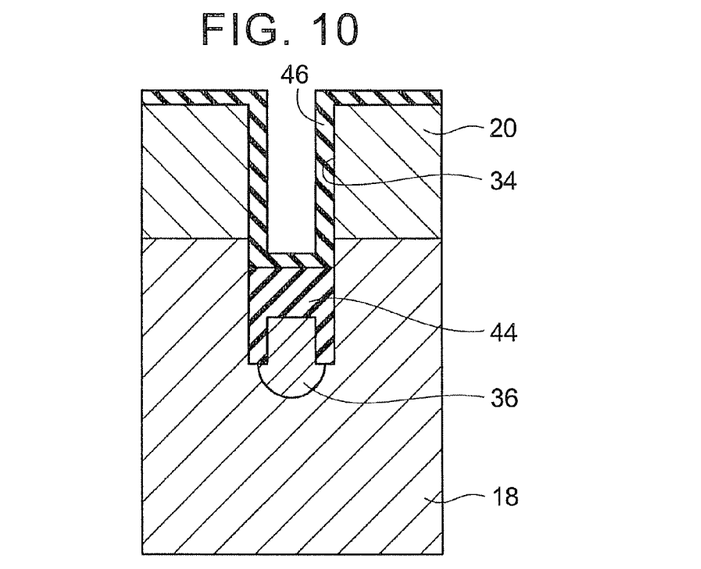
FIG. 10 is a diagram that illustrates a ninth process for producing the semiconductor device in FIG. 1.

Then, the insulators 38 and 40 remaining in the trench 34 are removed as shown in FIG. 7, and an insulator 44 is filled in the trench 34 by means of the CVD method, for example (FIG. 8). The insulator 44 is then removed to a desired position (a position where the gate electrode 28 is formed) by means of etching (FIG. 9). In addition, an insulator 46 is formed on the upper surface of the insulator 44 and the sides of the trench 34 (FIG. 10). The gate insulator 26 (that is, insulators 44 and 46) of the semiconductor device 10 is formed through the above processes. Then, the gate electrode 28 and the like can be formed by means of the well-known method. It should be noted that the p-type impurity region 36 is changed to the floating region 30 of the semiconductor device 10 through a subsequent heat treatment.

As described above, in the semiconductor device 10 of this embodiment, the inverted U-shaped section 27 is formed in the lower surface of the gate insulator 26, and the floating region 30 is formed in the inverted U-shaped section 27. Therefore, while the ON-resistance can be inhibited from increasing, the floating region 30 can be provided in the vicinity of the body region 20. Accordingly, field intensity applied on the gate insulator 26 can be reduced, and the possibility that the gate insulator 26 is damaged can be reduced.

As is apparent from the description of the production method described above, few p-type impurities are doped into the drift region 18 in the vicinity of the side of the gate trench 32, while the p-type impurities have been doped in order to form the floating region 30. In other words, the region where the p-type impurities have been doped (the region in the vicinity of the side of the trench 34) is removed by means of etching for achieving the state shown in FIG. 6 from the state shown in FIG. 5. Thus, the concentration of n-type impurities in the drift region 18 in the vicinity of the side of the gate trench 32 is approximately the same as the concentration of n-type impurities in the drift region 18 in other portions. Therefore, the drift region 18 in the vicinity of the side of the gate trench 32 hardly becomes depleted. Accordingly, the depletion layer extending from the floating region 30 can hardly connect to the depletion layer extending from the body region 20.

The source electrode 15 functions as a "first main electrode". The drain electrode 14 functions as a "second main electrode".

While the present invention has been described in detail with reference to example embodiments thereof, it is to be understood that those examples are merely illustrative and claims of the present invention are not limited to those examples. Techniques that are disclosed in the claims of the present invention are intended to cover various modifications and changes of the example embodiments that are described above.

For example, the floating region 30 fits within the width of the gate trench 32 in the above embodiment; however, the floating region may not fit within the width of the gate trench. Even when the floating region is laterally extended from the side of the gate trench, the connection between the depletion layer extending from the floating region and the depletion layer extending from the body region can be inhibited by adjusting the size of the floating region and the concentration of the impurities.

Figure 11:
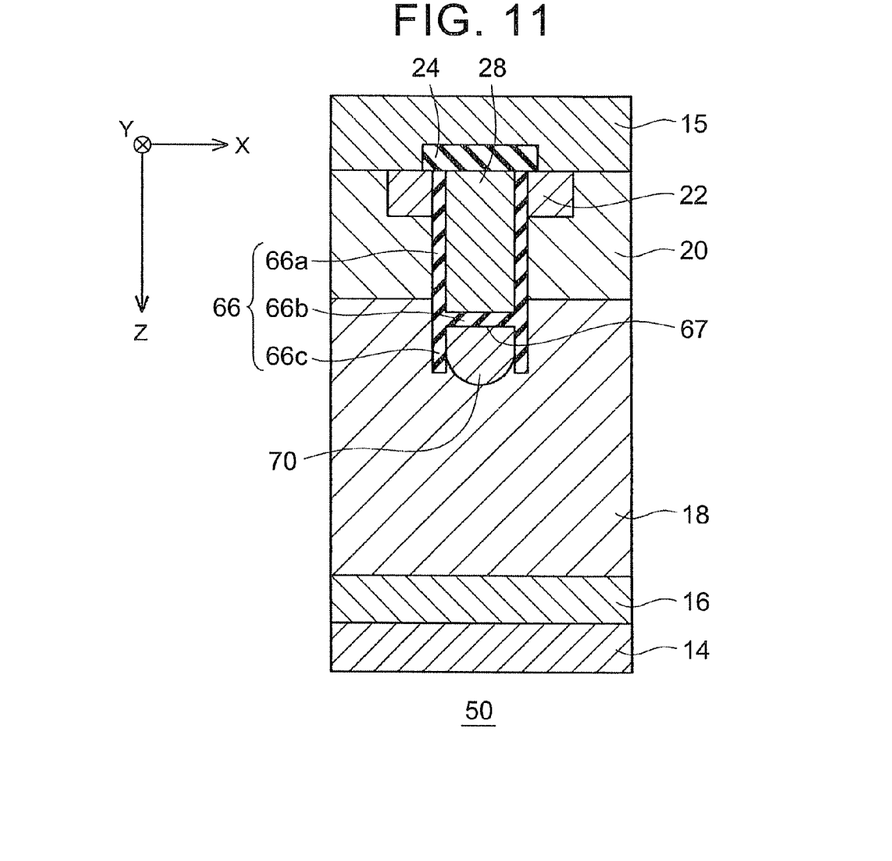
FIG. 11 is a vertical cross-sectional view of a semiconductor device according to a modification of the present invention.

Furthermore, as a semiconductor device 50 shown in FIG. 11, a floating region 70 may fit within the width of an inverted U-shaped section 67 (the width in the X-direction) that is formed in a gate insulator 66. Fitting the floating region 70 within the width of the inverted U-shaped section 67 can further inhibit the connection between the depletion layer extending from the floating region 70 and the depletion layer extending from the body region 20. In addition, as the semiconductor device 50 shown in FIG. 11, the thickness of each side surface portion 66a, the thickness of a lower surface portion 66b, and the thickness of each protruding portion 66c of the gate insulator 66 may be approximately equal to one another. In other words, the thickness of the lower surface portion 66b of the gate insulator 66 is not necessarily determined to be thicker than the thickness of the side surface portion 66a. However, as the semiconductor device 10 shown in FIG. 10, when the thickness of the lower surface portion 26b of the gate insulator 26 is thickened, a gate charge amount can be reduced. In addition, as shown in FIG. 11, the lower surface of the floating region 70 may be positioned under a portion that is located at a lowermost portion in the lower surface of the gate insulator 66, and a protruding amount can be determined as any amount.

In the embodiments described above, the semiconductor substrate has been exemplified in the MOSFET that is formed thereon; however, other semiconductor elements (for example, IGBT) may be formed of the semiconductor substrate. Furthermore, each of the embodiments described above was an example of the semiconductor device that had the first conductivity type of p-type and the second conductivity type of n-type; however, the present invention can be applied to a semiconductor device that has the first conductivity type of n-type and the second conductivity type of p-type.

The technical elements that are described in this specification and the drawings demonstrate technical utility when used singly or in various combinations. The techniques that are illustrated in this specification and the drawings achieve a plurality of objects simultaneously, and the achievement of one object thereof itself has technical usefulness.

What is claimed is:

1. A semiconductor device comprising:
   a semiconductor substrate that includes: a body region of a first conductivity type formed in an upper surface of the semiconductor substrate; a drift region of a second conductivity type that is contacted with a lower surface of the body region; a gate electrode that is provided in a gate trench passing through the body region and extending to the drift region and faces the body region; a gate insulator that is provided between the gate electrode and a wall surface of the gate trench and formed with an inverted U-shaped section in a lower surface; and a floating region of the first conductivity type that is enclosed by the inverted U-shaped section and the drift region and in which a lower surface of the floating region is formed under a portion that is located at a lowermost portion in the lower surface of the gate insulator;
   a first main electrode that is formed on the upper surface of the semiconductor substrate and connected to the body region; and
   a second main electrode that is formed on a lower surface of the semiconductor substrate.

2. The semiconductor device according to claim 1, wherein a width of the floating region fits within a range of a width of the gate trench in a cross section where the semiconductor substrate is cut away in a plane that is perpendicular to an upper surface of the semiconductor substrate and also orthogonal to a longitudinal direction of the gate trench.

3. The semiconductor device according to claim 2, wherein the width of the floating region fits within the width of the inverted U-shaped section in the cross section.

* * * * *